United States Patent
Zanchi

(10) Patent No.: US 8,237,488 B2
(45) Date of Patent: Aug. 7, 2012

(54) CONTINUOUS-TIME CIRCUIT AND METHOD FOR CAPACITANCE EQUALIZATION BASED ON ELECTRICALLY TUNABLE VOLTAGE PRE-DISTORTION OF A C-V CHARACTERISTIC

(75) Inventor: Alfio Zanchi, Colorado Springs, CO (US)

(73) Assignee: Aeroflex Colorado Springs Inc., Colorado Springs, CO (US)

( * ) Notice: Subject to any disclaimer, the term of this patent is extended or adjusted under 35 U.S.C. 154(b) by 215 days.

(21) Appl. No.: 12/775,381

(22) Filed: May 6, 2010

(65) Prior Publication Data

US 2011/0273229 A1 Nov. 10, 2011

(51) Int. Cl.
*G06F 7/64* (2006.01)
(52) U.S. Cl. ......................... 327/337; 327/382
(58) Field of Classification Search ............ 327/337, 327/382
See application file for complete search history.

(56) References Cited

U.S. PATENT DOCUMENTS

| | | | |
|---|---|---|---|
| 5,144,525 A * | 9/1992 | Saxe et al. ................ | 365/45 |
| 5,581,252 A | 12/1996 | Thomas | |
| 5,736,888 A * | 4/1998 | Sharpe-Geisler ........... | 327/382 |
| 6,084,440 A | 7/2000 | Sousa | |
| 6,124,818 A | 9/2000 | Thomas et al. | |
| 6,281,717 B1 | 8/2001 | Thomas et al. | |
| 6,480,052 B1 | 11/2002 | Pettersen | |
| 6,522,187 B1 | 2/2003 | Sousa | |
| 6,781,434 B2 | 8/2004 | Jensen et al. | |
| 6,853,272 B1 * | 2/2005 | Hughes ..................... | 334/15 |
| 6,970,031 B1 | 11/2005 | Martin et al. | |
| 7,209,016 B2 | 4/2007 | Perry et al. | |
| 7,279,994 B2 | 10/2007 | Takagi | |
| 7,280,001 B2 | 10/2007 | Maligeorgos et al. | |
| 7,382,593 B2 | 6/2008 | Miske et al. | |
| 7,444,252 B2 | 10/2008 | Sihvola | |
| 7,477,113 B1 * | 1/2009 | Hughes ................... | 331/177 V |
| 7,587,184 B2 | 9/2009 | Der et al. | |
| 7,683,695 B2 | 3/2010 | Sousa et al. | |
| 7,688,155 B2 | 3/2010 | Han et al. | |
| 2007/0103845 A1 | 5/2007 | Sousa et al. | |
| 2009/0121912 A1 | 5/2009 | Zanchi et al. | |

* cited by examiner

*Primary Examiner* — Kenneth B. Wells
(74) *Attorney, Agent, or Firm* — William J. Kubida; Peter J. Meza; Hogan Lovells US LLP

(57) ABSTRACT

A capacitance compensation circuit includes a plurality of switches having a first node coupled to an input terminal, a plurality of capacitors each coupled to a respective second node of the plurality of switches, and an adjustment circuit for providing a plurality of adjustable bias levels to a plurality of switch control nodes to precisely compensate for linear and parabolic voltage dependent components of an input or other capacitor. Two such circuits can be used with a single input terminal to compensate for both increasing and decreasing voltage dependent characteristics of a target capacitor.

13 Claims, 16 Drawing Sheets

US 8,237,488 B2

CONTINUOUS-TIME CIRCUIT AND METHOD FOR CAPACITANCE EQUALIZATION BASED ON ELECTRICALLY TUNABLE VOLTAGE PRE-DISTORTION OF A C-V CHARACTERISTIC

RELATED APPLICATIONS

The present application is related to my co-pending application, Ser. No. 12/775,406, filed May 6, 2010, entitled, "Electrically Tunable Continuous-Time Circuit and Method for Compensating A Polynomial Voltage-Dependent Characteristic of Capacitance", which is hereby incorporated in its entirety by reference.

BACKGROUND OF THE INVENTION

1. Field of the Invention

The present invention relates, in general, to a capacitance compensation circuit, and, more particularly, to a continuous-time circuit and method for compensating a polynomial voltage-dependent characteristic of a capacitor.

2. Relevant Background

Input-dependent capacitance constitutes one of the main limitations to the ideality of a radio-frequency (RF) as well as of an analog precision front-end. In fact, traditionally even necessary structures such as Electro-Static Discharge (ESD) protection diodes and other clamping circuitry have been minimized at the very input of those circuits, to try and mitigate the distortion effects caused by input-dependent capacitance. While the solution of minimizing the input structures may lessen the undesirable effect of input-dependent capacitance, it is not always practical depending on the specific application, nor does it substantially eliminate distortion. For extremely high precision circuits targeting 100 dB of dynamic range and higher, even the small amount of remaining input-dependent capacitance must be addressed. Thus, a need remains for a compensation circuit that can be adjusted to correct for the voltage-dependency in an input capacitor.

SUMMARY OF THE INVENTION

According to a first embodiment of the present invention, a capacitance compensation circuit includes an input terminal, a plurality of switches having a first node coupled to the input terminal, a plurality of capacitors each coupled to a respective second node of the plurality of switches, and a tuning circuit for providing a plurality of adjustable bias levels to a plurality of switch control nodes.

According to a second embodiment of the present invention, a capacitance compensation circuit includes an input terminal, a circuit to compensate for input capacitance increasing against the input terminal voltage, including a first plurality of switches having a first node coupled to the input terminal, a first plurality of capacitors each coupled to a respective second node of the first plurality of switches, and a first adjustment circuit for providing a first plurality of adjustable bias levels to a first plurality of switch control nodes; and a circuit to compensate for input capacitance decreasing against the input terminal voltage, including a second plurality of switches having a first node coupled to the input terminal, a second plurality of capacitors each coupled to a respective second node of the second plurality of switches, and a second adjustment circuit for providing a second plurality of adjustable bias levels to a second plurality of switch control nodes.

According to a third embodiment of the present invention, a capacitance compensation circuit includes an input terminal, a plurality of varactors having a first node coupled to the input terminal, and an adjustment circuit for providing a plurality of adjustable bias levels to a plurality of second varactor nodes.

According to a fourth embodiment of the present invention, a capacitance compensation circuit includes an input terminal, a circuit to compensate for input capacitance increasing against the input terminal voltage, including a first plurality of varactors having a first node coupled to the input terminal, and a first adjustment circuit for providing a first plurality of adjustable bias levels coupled to a first plurality of second varactor nodes; and a circuit to compensate for input capacitance decreasing against the input terminal voltage, including a second plurality of varactors having a first node coupled to the input terminal, and a second adjustment circuit for providing a second plurality of adjustable bias levels to a second plurality of second varactor nodes.

BRIEF DESCRIPTION OF THE DRAWINGS

The foregoing and other features, utilities and advantages of the invention will be apparent from the following more particular description of an embodiment of the invention as illustrated in the accompanying drawings, in which.

DETAILED DESCRIPTION

In a co-pending application entitled, Electrically Tunable Continuous-Time Circuit and Method for Compensating A Polynomial Tunable Voltage-Dependent Characteristic of Capacitance, the detrimental effects of a non-linear capacitance CIN(VIN) over harmonic distortion in various applications have been discussed. A solution based on compensating ON(VIN) with a CCOMP(VIN) in such a way that CIN (VIN)+CCOMP(VIN)=CTOT, with CTOT substantially independent from VIN is the most practical way of linearizing the front-end of those impacted electrical systems.

While an invention based on the "C" tuning (i.e. of the y-axis, or the ordinate) of the C(V) characteristic of the circuit has been proposed to synthesize such $C_{COMP}(V_{IN})$ and is most immediate, an equally effective solution can be devised by exploiting the "V" tuning (i.e. the x-axis, or the abscissa) of the C(V) characteristic. It has been noticed how any x-axis distortion effect is actually detrimental for the efficacy of the solution when a y-axis technique is employed. However, obtaining a tunable straight line or parabola just modulating the x-axis and not the y-axis of the characteristic can lead to the same operational results. The principles of the invention are discussed below in turn with respect to the $2^{nd}$ and $3^{rd}$ harmonic.

Figure 1:
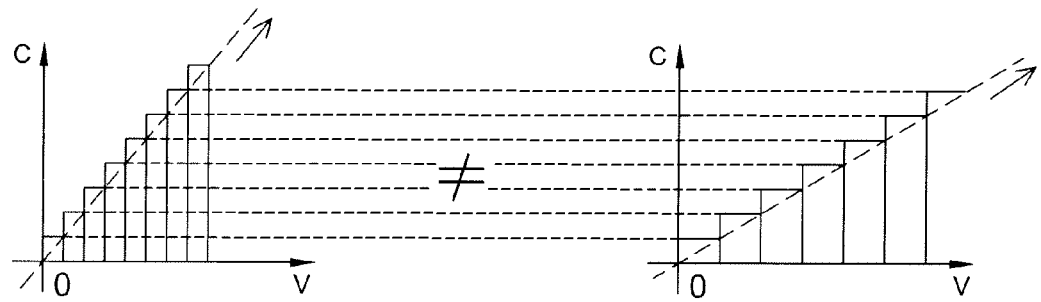
FIG. 1 includes two graphs for showing the piece-wise linear approximation of a compensation capacitive characteristic having a first increasing linear voltage dependence, and a second increasing linear voltage dependence of lesser slope.

Capacitance compensation of the second harmonic (HD2), corresponding to a linear variation of $C_{IN}$ versus $V_{IN}$, is now discussed with reference to FIG. 1. If the principle of capacitance accumulation against input voltage is still adopted, a linear C(V) curve is still obtained when the capacitance values at each step are maintained constant, provided the voltage steps' spans are kept identical to each other. However, by distancing more, or less, the occurrence of the capacitance switching points in FIG. 1, the slope $$\frac{dC}{dV}$$

of the curve can be modified as shown. An equal dC in the face of a modified dV yields a different $$\frac{dC}{dV}.$$

In summary, the tuning principle can be applied to the co-pending invention application not by modifying the C+ or C− accumulated at each comparator's transition, but rather the occurrence of the transition itself.

Figure 2:
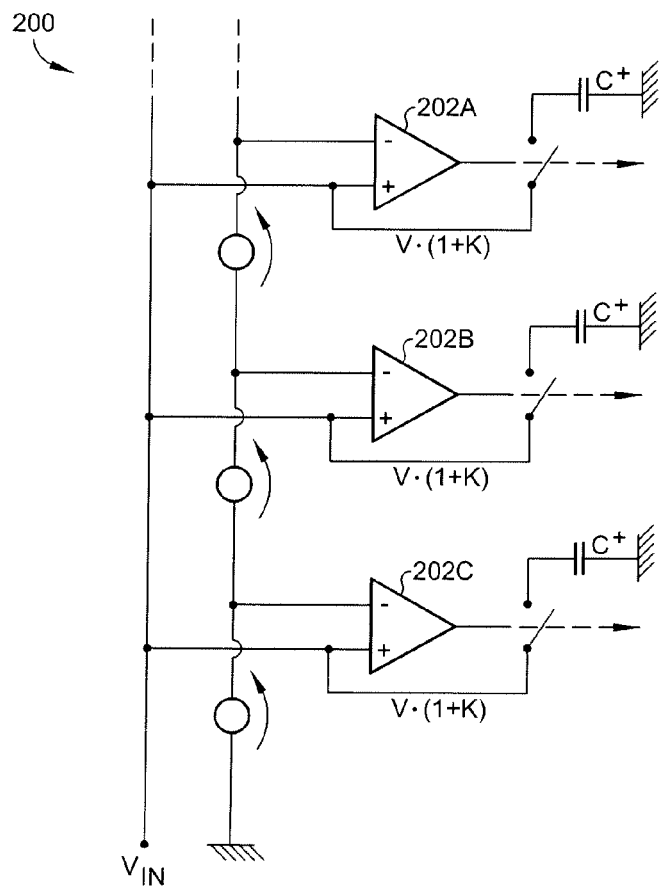
FIG. 2 is a schematic diagram of a portion of a capacitive compensation circuit according to the present invention for effecting a linear increase in capacitance with voltage.

A circuit 200 is shown in FIG. 2 in which the slope of the C(V) curve can be adjusted, including a $V_{IN}$ input voltage terminal, a plurality of comparators 202A, 202B, 202C, a plurality of switches coupled to the output of the comparators, and a plurality of capacitors C+ coupled between the plurality of switches and ground. The positive inputs of the comparators are coupled together and to the input voltage terminal. The negative inputs of the comparators receive an increasing bias voltage to achieve the transitions as shown in FIG. 1. The bias voltages shown in FIG. 2 can be achieved by many different methods known to those skilled in the art.

For example, using a resistor chain and modulating the bias current in it, an ohmic $R \cdot I_{HD2}$ drop is achieved for each rung of the resistor ladder, that can be varied via $I_{HD2}$. Utilizing a differential configuration with C+ and C− identical capacitors, but modulating in opposite directions the distance between the rungs of the ladder for the comparators connected in the + and − schemes, a slope tuning is easily achieved. A fully realized capacitance compensation circuit according to the present invention is discussed in further detail below.

Figure 3:
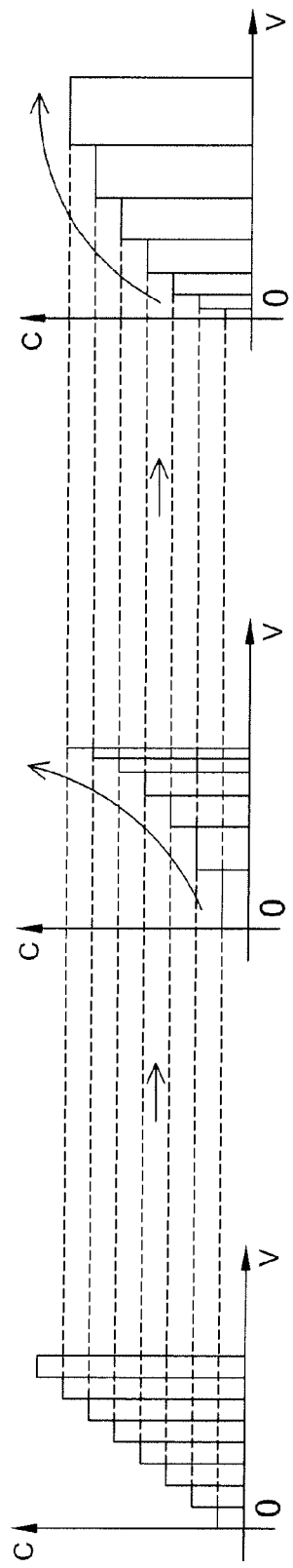
FIG. 3 is a graph showing the piece-wise linear approximation of a compensation capacitive characteristic having a linear increasing voltage dependency, a parabolic concave voltage dependency, and a parabolic convex voltage dependency according to the present invention.

Capacitance compensation of the third harmonic (HD3), corresponding to a parabolic variation of $C_{IN}$ versus $V_{IN}$, is now discussed with reference to FIG. 3. The exact same principle stated above is applied to generate a parabola. Notice how the incremental levels of capacitance are maintained identical across the three plots in figure. In this instance, however, the spans between the comparator thresholds' rungs are spaced quadratically as is shown in FIG. 3. In FIG. 3, a linear C(V) is shown in the left portion of the figure; a concave parabola C(V) approximation in the center portion of the figure; and a convex parabola C(V) approximation in the right portion of the figure.

Figure 4:
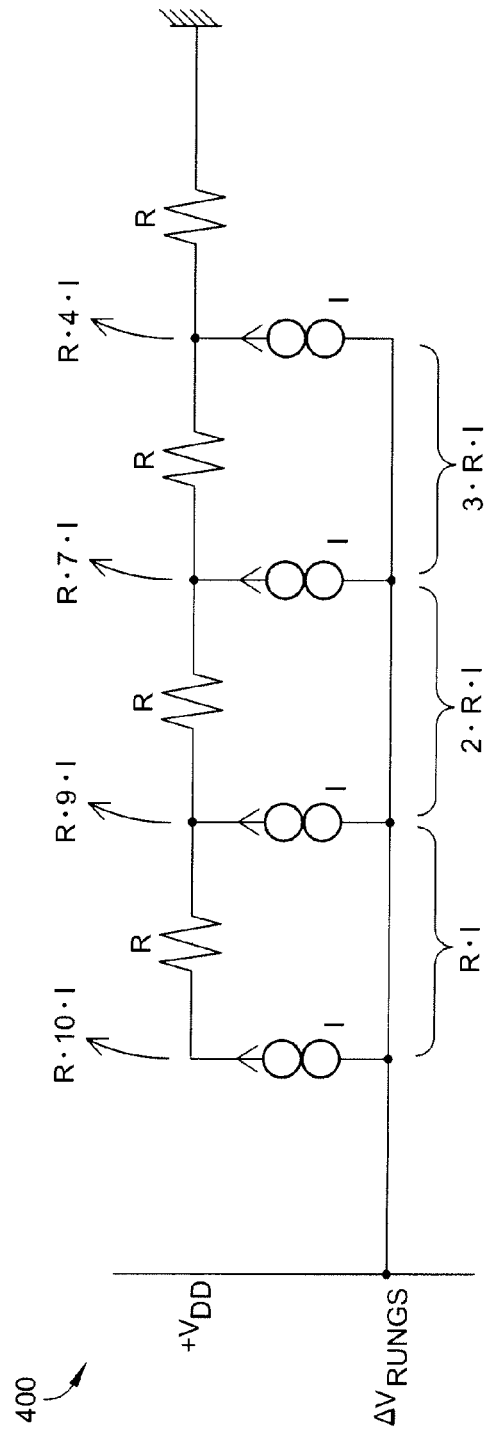
FIG. 4 is a schematic of a quadratic biasing circuit according to the present invention.

Therefore, unlike in previous implementations where the integral action of linearly increasing capacitors C+ would produce a quadratic curve, here the quadratic characteristic has instead to be imparted on the step threshold's sequence. Rather than achieving this by quadratic sizing of the resistor rungs, which would be practically disadvantageous and incompatible with the solution proposed to minimize HD2, the current flowing into the resistors can be quadratically regulated with the following circuit 400 shown in FIG. 4. Circuit 400 includes a resistor string having a current source coupled to the intermediate nodes of the resistor string. The dV span now is no longer constant but varies linearly as shown in FIG. 4, and therefore $$\Delta V = \int dV_{rung}(V)$$

is now quadratic.

Figure 5:
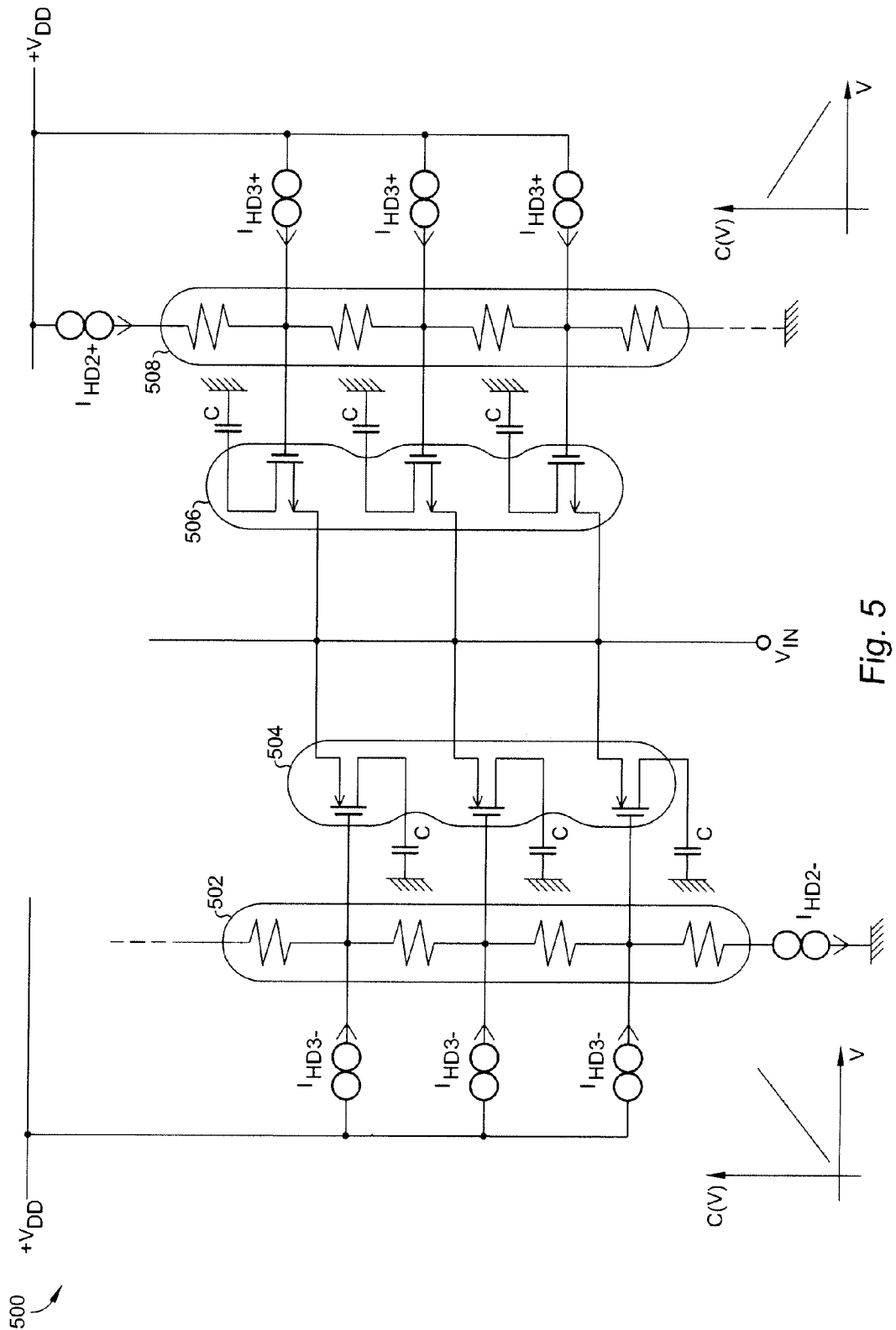
FIG. 5 is a schematic diagram of a first embodiment of a variable compensation capacitor circuit for use in the present invention.

With this sort of threshold arrangement, only identical capacitors can be used if so desired. An implementation based on single NMOSFET and PMOSFET switches is shown in FIG. 5. Circuit 500 includes first and second portions for addressing all HD2 and HD3 characteristics of the C(V) of an input capacitor. Thus, circuit 500 includes a plurality of PMOSFET switches 504 wherein the sources are coupled to the input terminal and the drains are coupled to a plurality of identical capacitors, C. The gates of the PMOSFET switches 504 receive a bias voltage from resistor string 502. The resistance of each of the resistors in resistor string 502 is substantially equal. Resistor string 502 is in turn biased via the adjustable bias current source $I_{HD2-}$. The intermediate nodes of the resistor string 502 are additionally biased through bias current sources $I_{HD3-}$ as shown in FIG. 5. Circuit 500 also includes a plurality of NMOSFET switches 506 wherein the sources are coupled to the input terminal and the drains are coupled to a plurality of identical capacitors, C. The gates of the NMOSFET switches 506 receive a bias voltage from resistor string 508. The resistance of each of the resistors in resistor string 508 is substantially equal. Resistor string 508 is in turn biased via the adjustable bias current source $I_{HD2+}$. The intermediate nodes of the resistor string 508 are additionally biased through bias current sources $I_{HD3+}$ as shown in FIG. 5. Thus, circuit 500 includes at least four separate bias controls for compensating all possible HD2 and HD3 characteristics of the input capacitance.

The PMOS-side and NMOS-side rungs of the ladders, respectively 502 and 508, can be conveniently shifted to align the transition points between the two halves of the circuit, and also compensate for the body effects of the switches. In this respect, intermingling MOSFET diodes whose forward voltage drop is dependent on VTH, with the resistors in the chain driving the gates, could be beneficial. Of course, varying IHD2+ out of phase with respect to IHD2− maximizes the CCOMP(V) slant while retaining the odd symmetry of the circuit.

A potential drawback of the circuit shown in FIG. 5 resides in the abrupt switching of the capacitors in parallel with the input VIN, once the respective NMOSFET/PMOSFET switch is turned on/off. While spacing the devices close together (ideally, ΔVRung<<VTH) improves the granularity of this piece-wise linear solution, an alternative technique exploiting these same device's thresholds is to use their own capacitance. As mentioned in ELECTRICALLY TUNABLE CONTINUOUS-TIME CIRCUIT AND METHOD FOR COMPENSATING A POLYNOMIAL VOLTAGE-DEPENDENT CHARACTERISTIC OF CAPACITANCE, a varactor's C(V) curve can be linear over a 1÷2V voltage span in a state-of-the-art MOSFET capacitance. Therefore, once ΔVrung<1÷2V, the total CCOMP(V) plot becomes smoother, and the characteristic does not show virtually any piece-wise linear, abrupt transitions. While, without switches or intermediate blocking capacitors, the individual capacitances themselves are now governed by VIN, once their C(V) plots overlap each other the total CCOMP(VIN) is largely governed by the x-axis (or, the ΔVrung spans), which provides a capability for capacitance fine-tuning with no chance of leakage other than through the MOS oxide. The structure also could use p- and n-MOS varactors, in accumulation or inversion, depending on the input frequency requirements of the front-end. Notice that the smoother C(V) characteristic of accumulation varactors is preferable in this embodiment.

Figure 6:
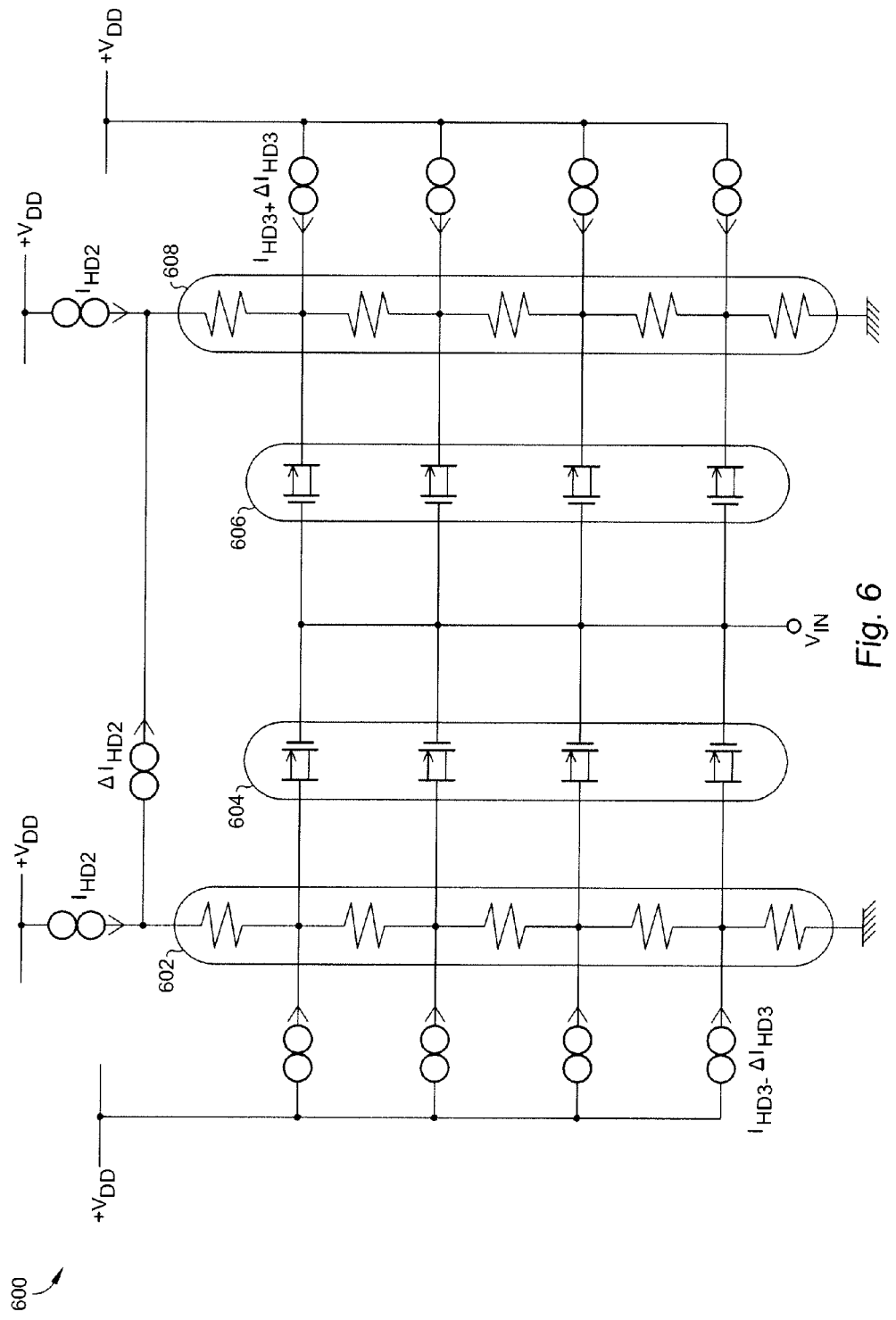
FIG. 6 is a schematic diagram of a second embodiment of a variable compensation capacitor circuit for use in the present invention.

A varactor embodiment of the circuit of the present invention is thus shown in FIG. 6. Circuit 600 includes a plurality of P-varactors 604 each having a gate coupled to the input voltage terminal. A resistor string 602 provides the bias voltage for the opposite terminal. Resistor string 602 is coupled to bias current $I_{HD2}$ for linearly adjusting the bias voltages as previously discussed. The intermediate nodes of the resistor string 602 are coupled to a plurality of bias currents $I_{HD3}$−$ΔI_{HD3}$ for quadratically adjusting the bias voltages as previously discussed. Circuit 600 also includes a plurality of N-varactors 606 each having a gate coupled to the input voltage terminal. A resistor string 608 provides the bias voltage for the opposite terminal. Resistor string 608 is coupled to bias current $I_{HD2}$ for linearly adjusting the bias voltages as previously discussed. The two $I_{HD2}$ bias currents are coupled through an additional $ΔI_{HD2}$ current source as shown in FIG. 6, that varies the rung spans out of phase for the p- and n-MOS varactors. The intermediate nodes of the resistor string 608 are coupled to a plurality of bias currents $I_{HD3}$+$ΔI_{HD3}$ for quadratically adjusting the bias voltages as previously discussed. While an HD3 tuning method out of phase for the p- and n-MOS varactor sides is represented in FIG. 6, variants of the method with or without a constant $I_{HD3}$ bias, or in phase on both p- and n-MOS varactor sides can also be envisioned. While a particular biasing scheme is shown in FIG. 6, it will be apparent to those skilled in the art that the biasing voltages can be provided in other ways that are consistent with the principles of the invention taught herein.

An additional advantage of the structure shown in FIG. 6 is its suitability for technologies where only one type of accumulation varactor is available (e.g. the gate/n+well). This kind of technological impasse is solved by simply reversing the gate/well connection for the N-varactor used in lieu of the P-varactor (or vice versa). Of course, usage of NMOSFET and PMOSFET transistor structures in inversion mode, or used as capacitors, would remove any technological hurdle yet possibly at the expense of the curves' smoothness. Usually C(V) curves for transistors are steeper than their corresponding counterparts for accumulation varactor devices.

The circuits of the present invention do not require input buffering, level shifting, or re-sampling. They can therefore be directly coupled to the RF or analog precision front-end inputs to the I.C. (integrated circuits) in continuous time, thereby compensating the continuous-time $C_{IN}(V_{IN})$ at each instant, with optimal results with regards to the input matching to the off-chip driver, and to the reduction of charge-injection induced glitches.

A measure of the linearity of the front-end, or of the system as a whole that encompasses the front-end, can be used as a figure of merit to steer the input capacitance balancing process. For lack of direct capacitance measurements, usually extremely challenging when feasible at all, parameters such as the Spurious-Free Dynamic Range (SFDR) of an opamp or an A-to-D converter (ADC), the Integral Non-Linearity (INL) of an ADC, or the Adjacent Channel Power Ratio (ACPR) in communication apparata, can be elected as feedback parameters of such tuning process.

FIGS. 7-24 are performance graphs illustrating the various operating modes and improvement in performance over the prior art realized with the circuit and method of the present invention.

Figure 7:
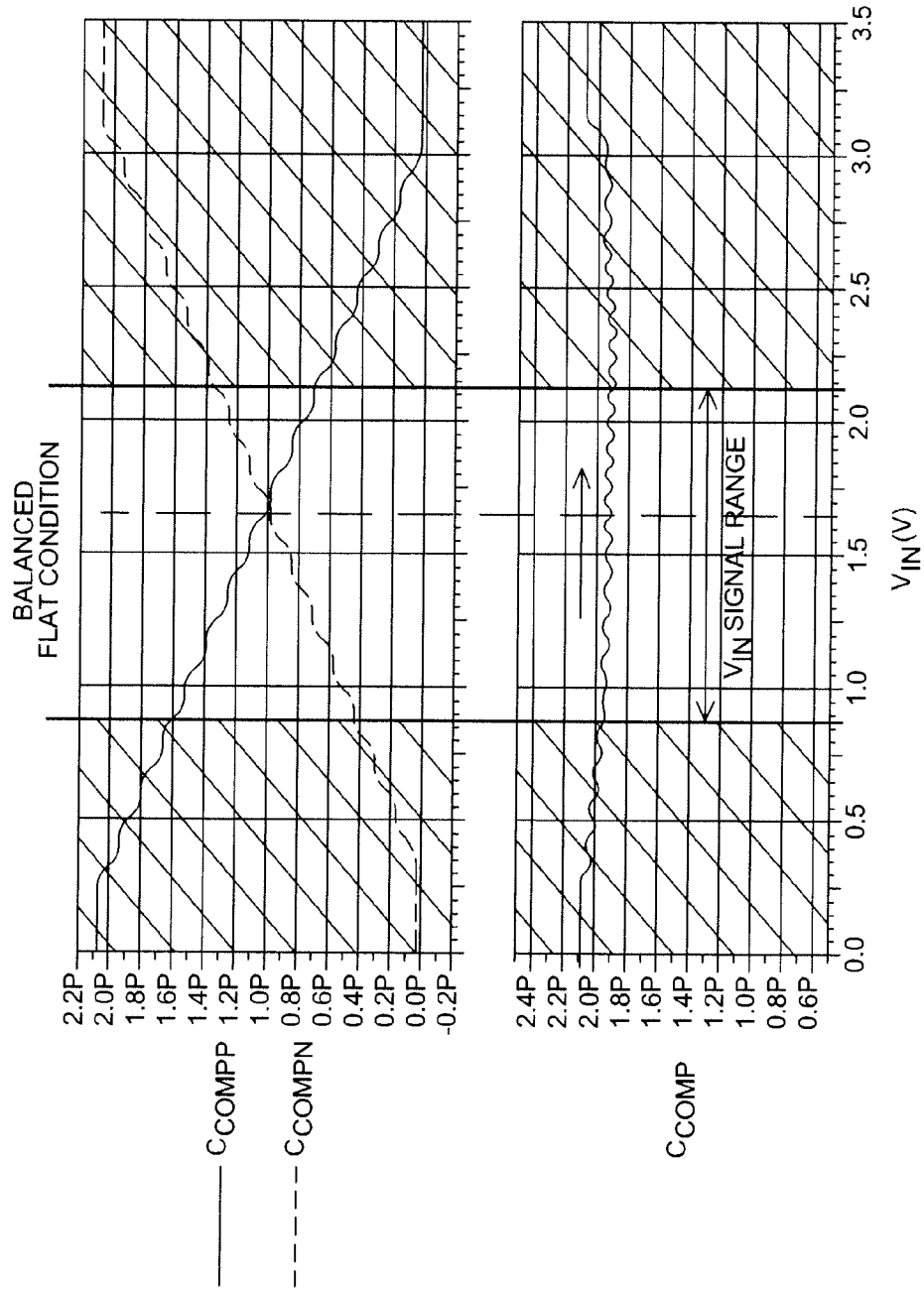
FIGS. 7-18 are performance graphs illustrating the various operating modes and improvement in performance over the prior art realized with the circuit and method of the present invention.

FIG. 7 shows the case when the embodiment of the invention depicted in FIG. 5 is operated in a balanced condition, in which the threshold sequences of sets 502 and 508 is made identical by imparting the same current $I_{HD2+}$=$I_{HD2-}$ on both, with $I_{IHD3+}$=$I_{HD3-}$=0. Since the positive and negative slopes of the C(V) of both halves of FIG. 5 are identical and no curvature is imparted, the total compensation capacitance seen at the input terminal is flat against $V_{IN}$ at about 2 pF. Higher or lower capacitance values can be synthesized by instancing larger or smaller devices in the physical implementation of the circuit.

Figure 8:
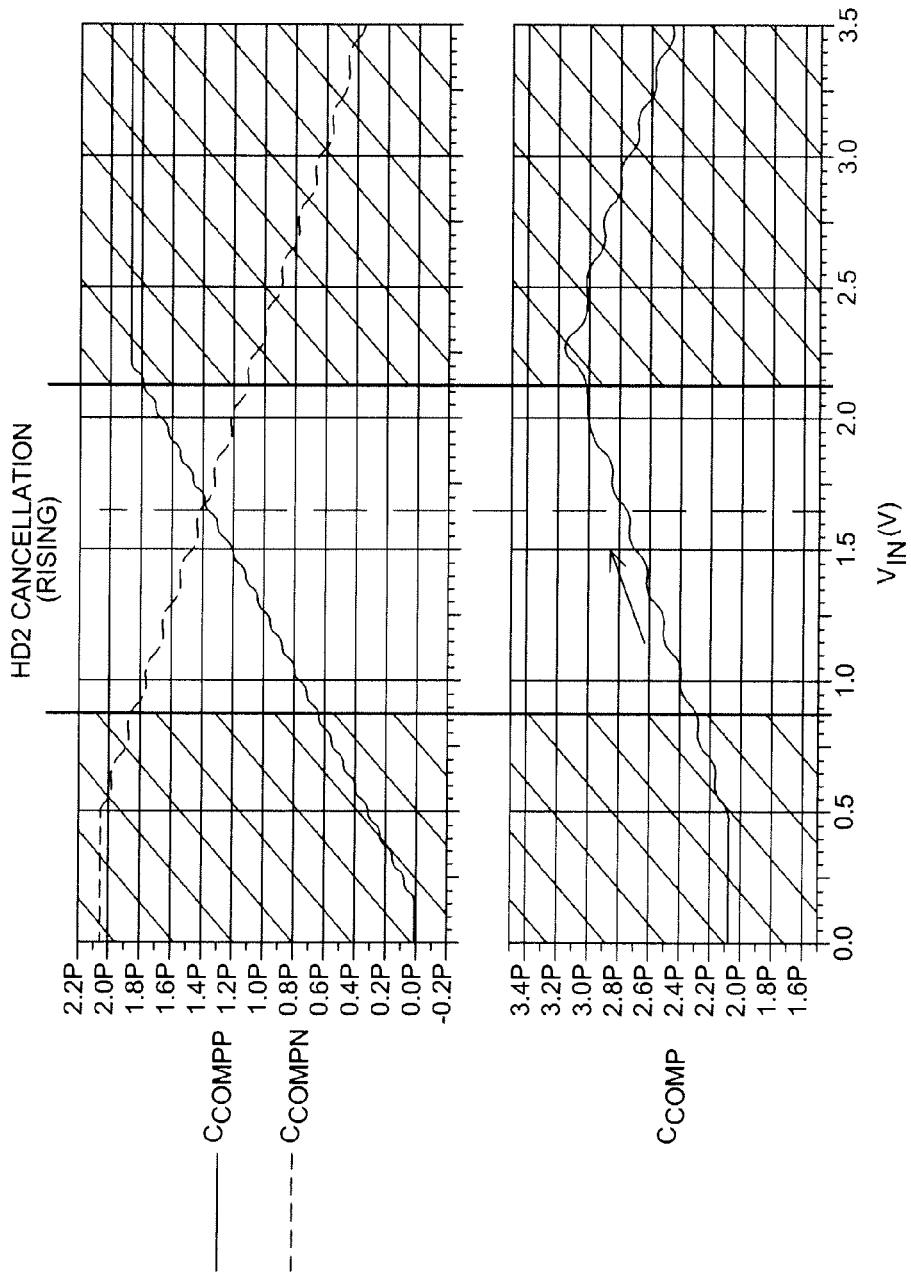

FIG. 8 shows a case when the embodiment of the invention depicted in FIG. 5 is operated to provide HD2 cancellation. The rung span size of set 502 is driven lower than the rung step size of set 508 by imparting a current $I_{HD2-}$<$I_{HD2+}$, while keeping $I_{IHD3+}$=$I_{IDH3-}$=0. Since the positive C(V) slope synthesized by the capacitor set 504 exceeds the negative C(V) slope synthesized by the capacitor set 508 and no curvature is imparted, the total compensation capacitance seen at the input terminal is linearly increasing against $V_{IN}$.

Figure 9:
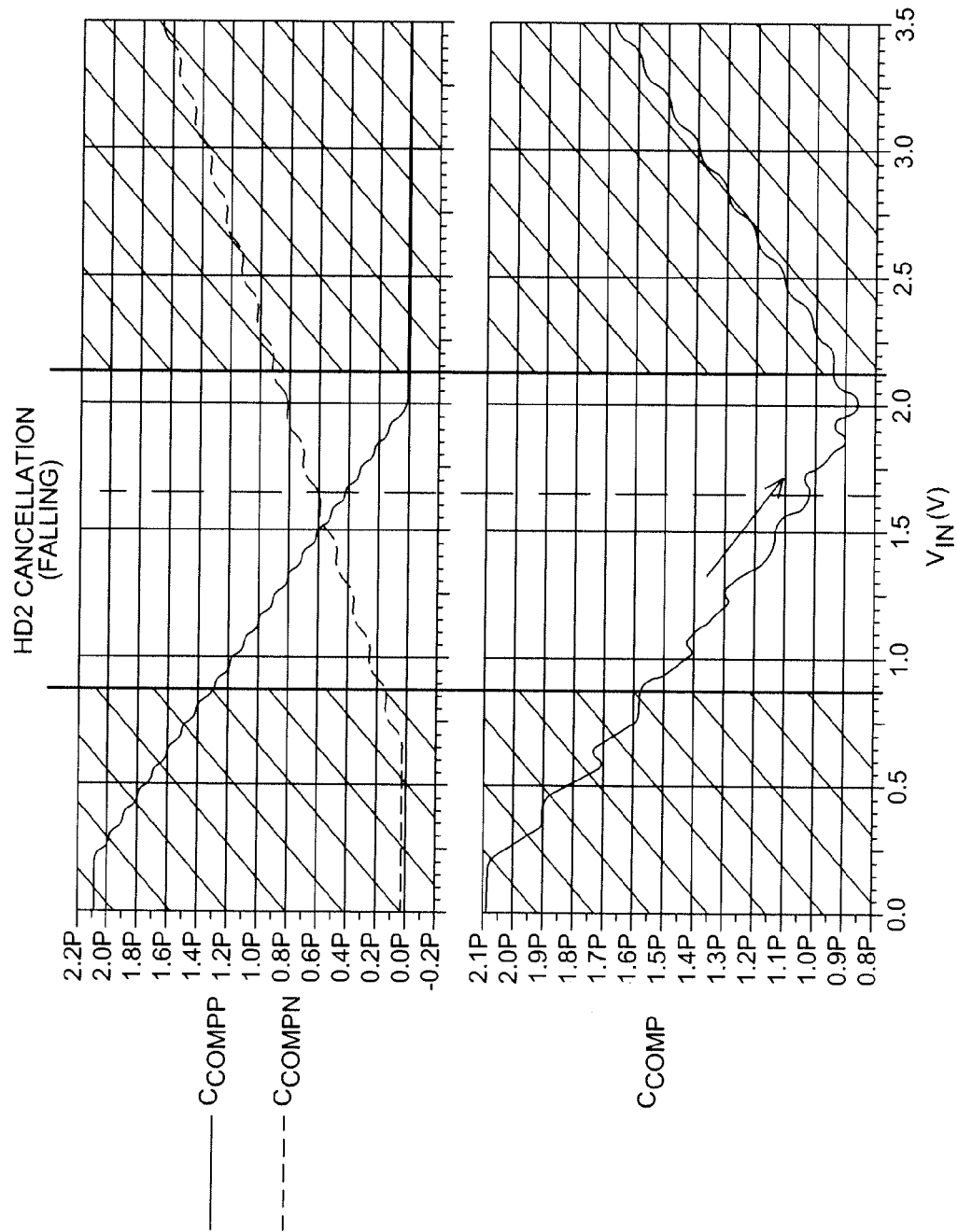

FIG. 9 shows an alternative case when the embodiment of the invention depicted in FIG. 5 is operated to provide HD2 cancellation. The rung span size of set 502 is driven higher than the rung step size of set 508 by imparting a current $I_{HD2-}$>$I_{HD2+}$, while keeping $I_{IHD3+}$=$I_{IDH3-}$=0. Since the positive C(V) slope synthesized by the capacitor set 504 is exceeded by the negative C(V) slope synthesized by the capacitor set 508 and no curvature is imparted, the total compensation capacitance seen at the input terminal is linearly decreasing against $V_{IN}$.

Figure 10:
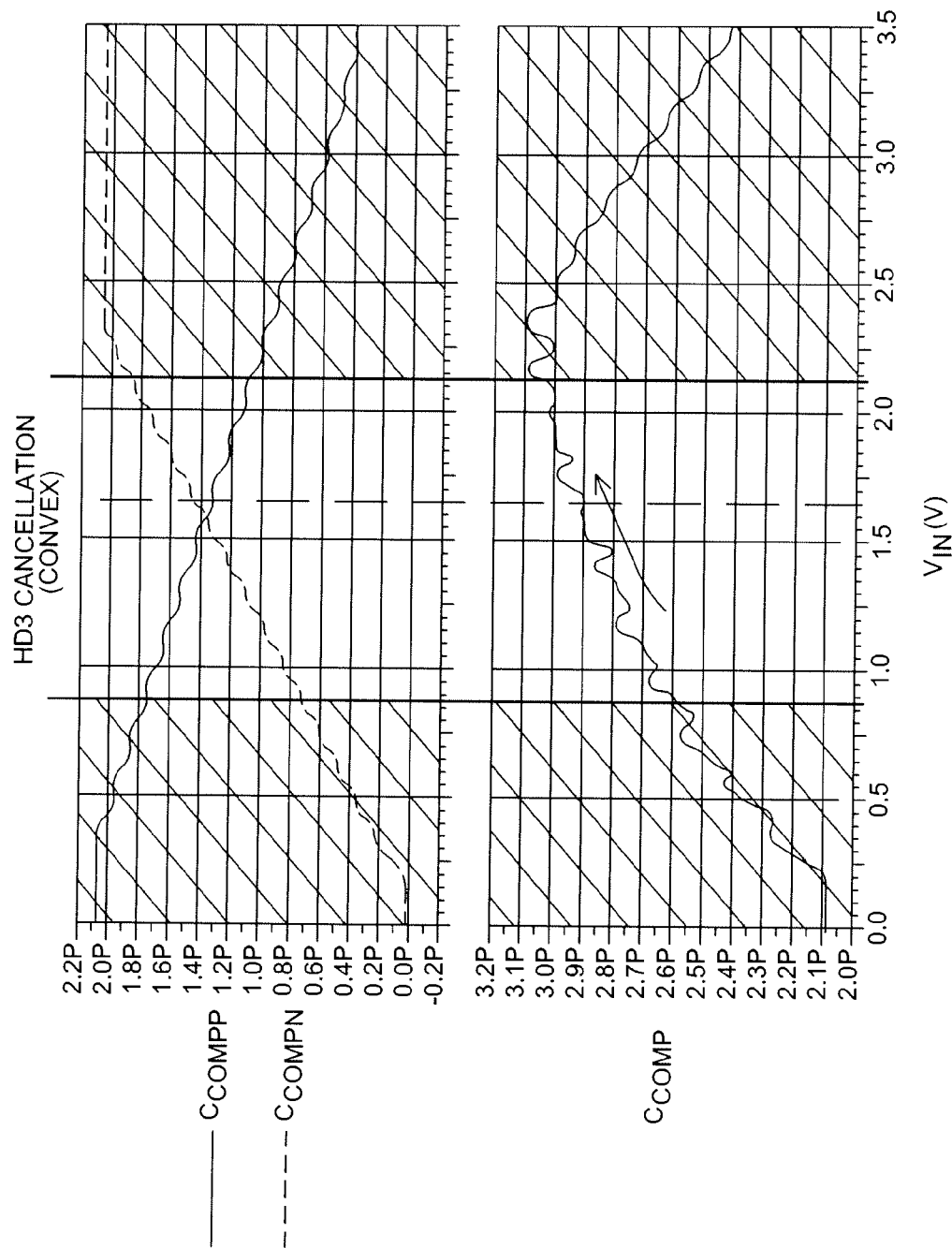

FIG. 10 shows a case when the embodiment of the invention depicted in FIG. 5 is operated to provide HD3 cancellation. The progressively increasing (for increasing $V_{IN}$) rung step size in set 502 is opposed to a constant rung step size in set 508 by keeping identical currents $I_{HD2-}$=$I_{HD2+}$ while imparting $I_{HD3-}$>$I_{HD3+}$=0 on the two branches. Since the convex parabolic C(V) curvature synthesized by the capacitor set 504 is combined with virtually no C(V) curvature synthesized by capacitor set 506, the total compensation capacitance seen at the input terminal is convex parabolic against $V_{IN}$. The residual linear slope is a byproduct of the combination of the two curves and can be eliminated with the technique previously described, if so desired.

Figure 11:
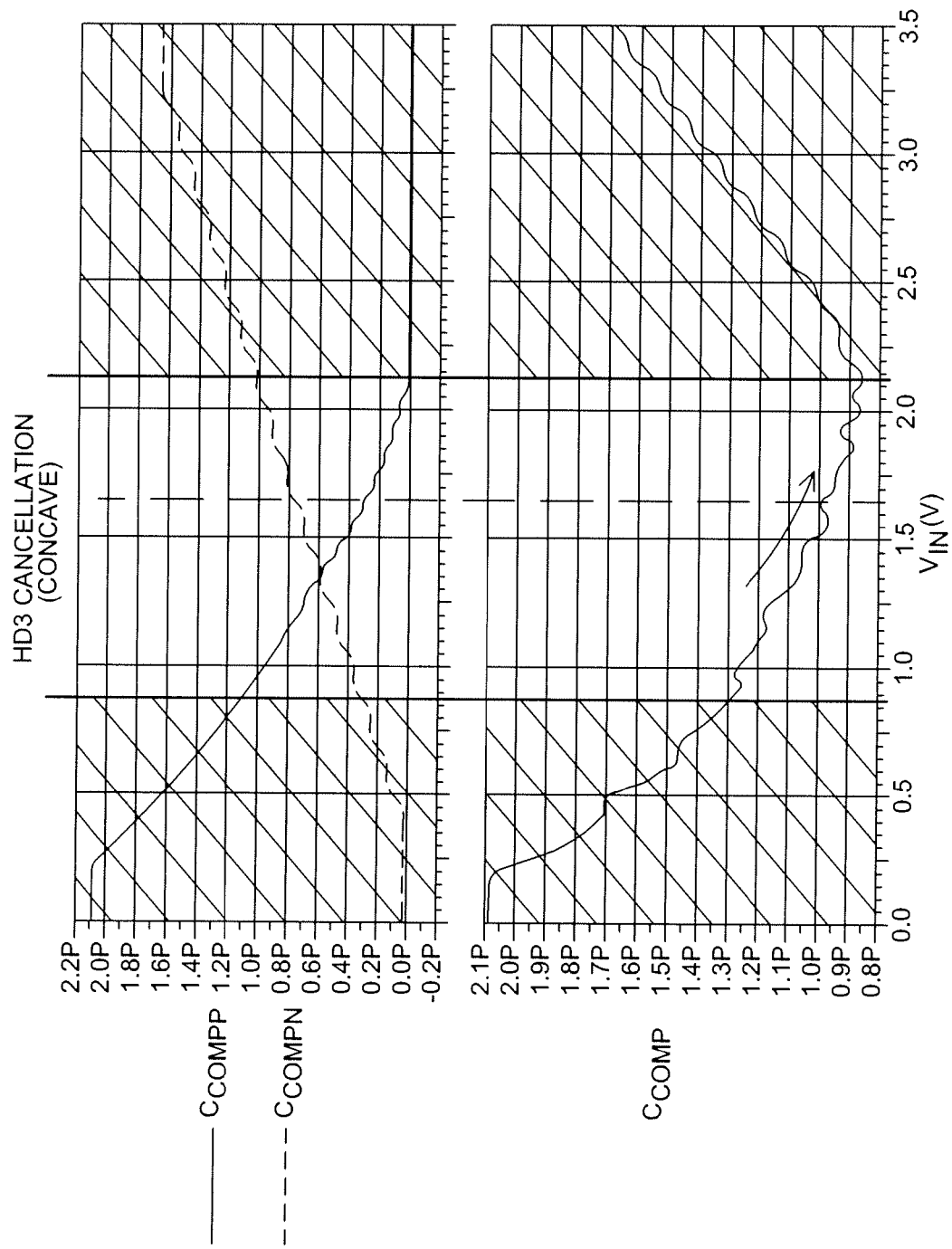

FIG. 11 shows an alternative case when the embodiment of the invention depicted in FIG. 5 is operated to provide HD3 cancellation. The constant (for increasing $V_{IN}$) rung step size in set 502 is opposed to a progressively decreasing rung step size in set 508 by keeping identical currents $I_{HD2-}$=$I_{HD2+}$ while imparting $I_{HD3+}$<$I_{HD3-}$=0 on the two branches. Since virtually no C(V) curvature synthesized by the capacitor set 504 is combined with the concave parabolic C(V) curvature synthesized by capacitor set 506, the total compensation capacitance seen at the input terminal is concave parabolic against $V_{IN}$. The residual linear slope is a byproduct of the combination of the two curves and can be eliminated with the technique previously described, if so desired.

Figure 12:
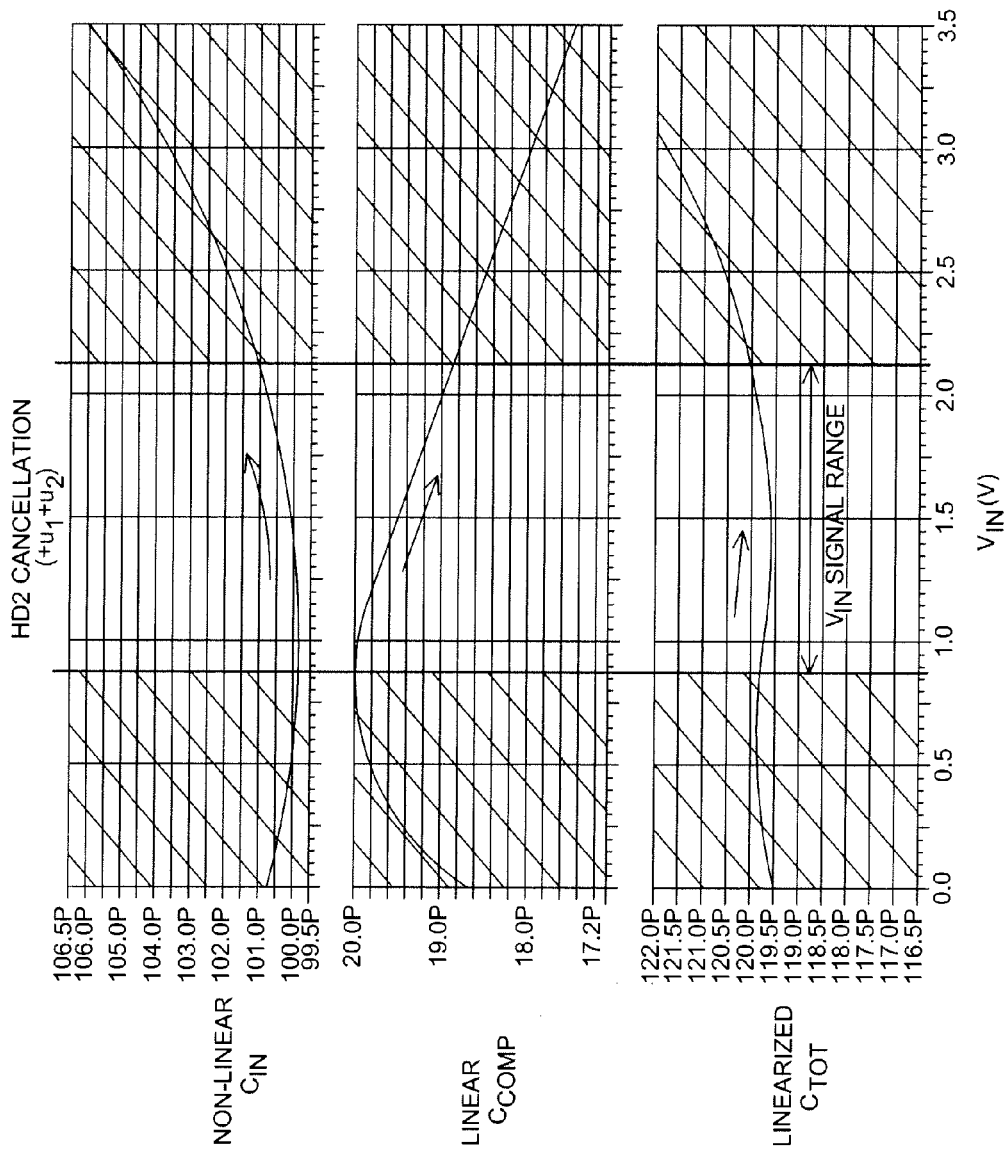

FIG. 12 shows a case when the embodiment of the invention depicted in FIG. 6 is operated to provide HD2 cancellation. The linear increase of a linear+parabolic concave $C_{IN}(V_{IN})$ characteristic (top plot) is compensated by the linearly decreasing $C_{COMP}(V_{IN})$ synthesized by the invention circuit (middle plot). The linear component of the overall $C_{TOT}(V_{IN})$ (bottom plot) is substantially eliminated and only the residual parabolic concave dependency is visible after the correction.

Figure 13:
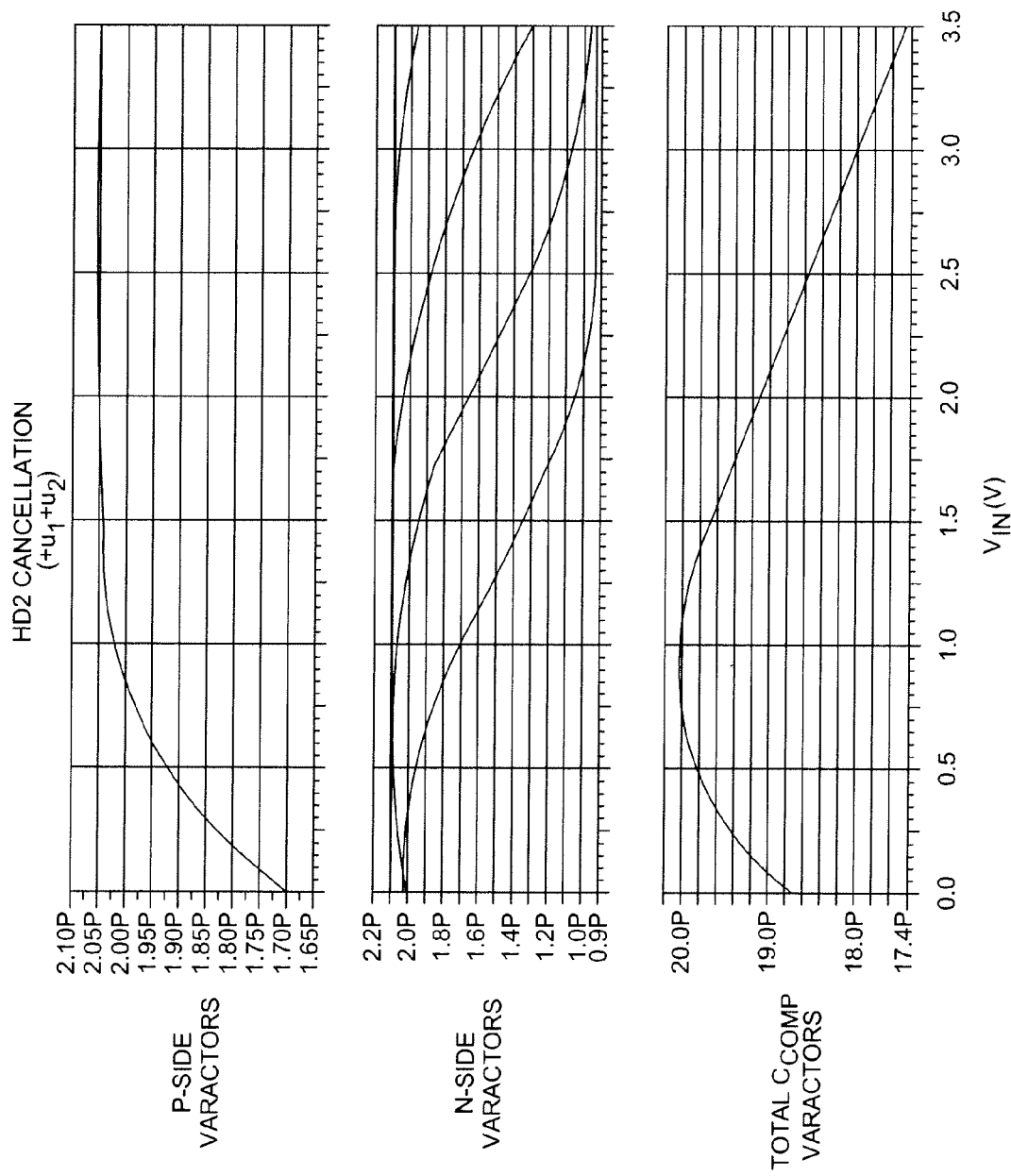

FIG. 13 shows the detail of the staggered varactor capacitive characteristics, as positioned on the x-axis by the bias tuning circuit of the embodiment of FIG. 6. The parallel combination of the varactors of set 604 (top plot) and set 606 (middle plot) yields a characteristic $C_{COMP}(V_{IN})$ (bottom plot) which is linearly decreasing in the operative region of interest.

Figure 14:
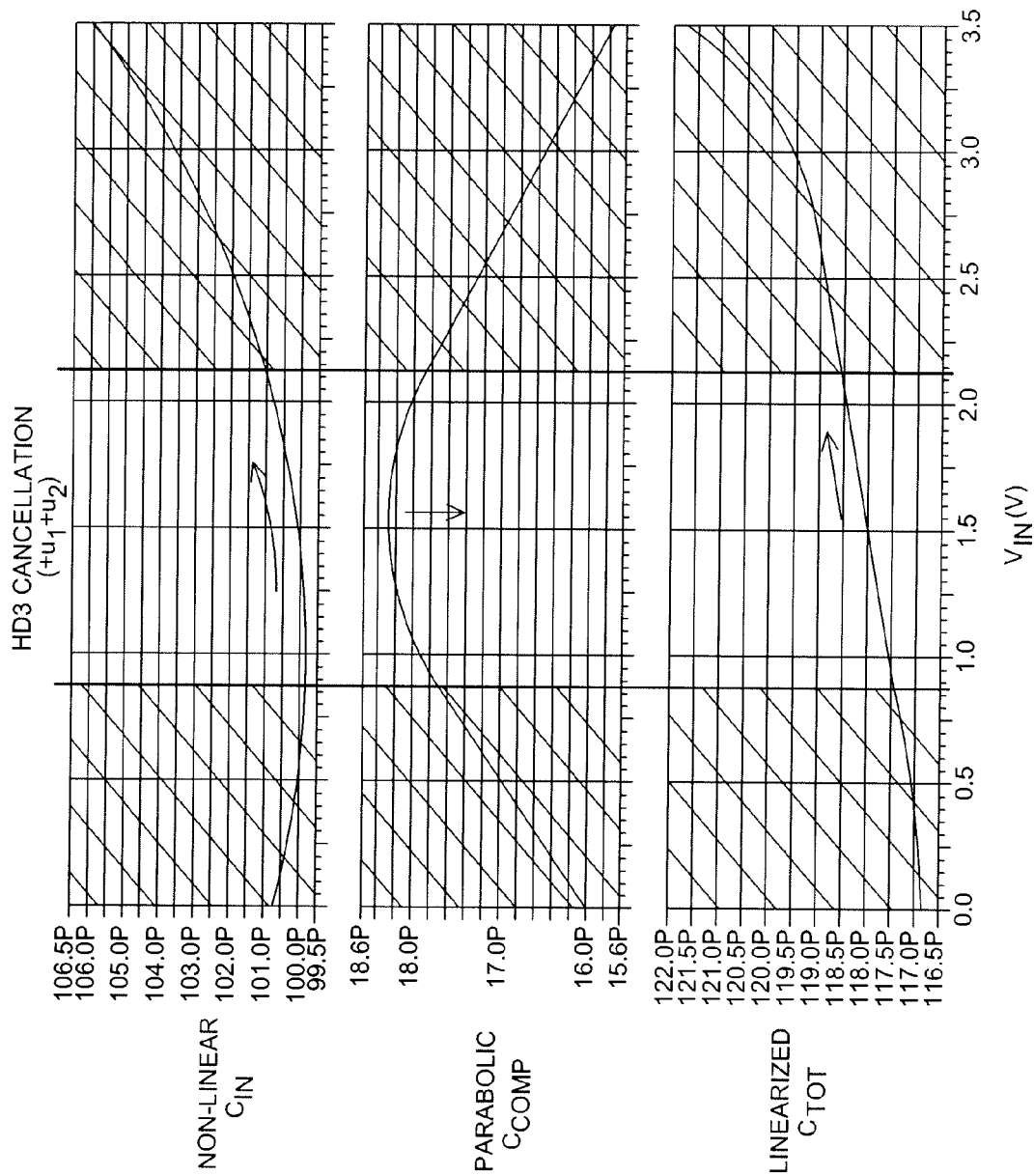

FIG. 14 shows a case when the embodiment of the invention depicted in FIG. 6 is operated to provide HD3 cancellation. The concave curvature of a linear+parabolic concave $C_{IN}(V_{IN})$ characteristic (top plot) is compensated by the parabolically convex $C_{COMP}(V_{IN})$ synthesized by the invention circuit (middle plot). The parabolic component of the overall $C_{TOT}(V_{IN})$ (bottom plot) is substantially eliminated and only the residual linearly increasing dependency is visible after the correction.

Figure 15:
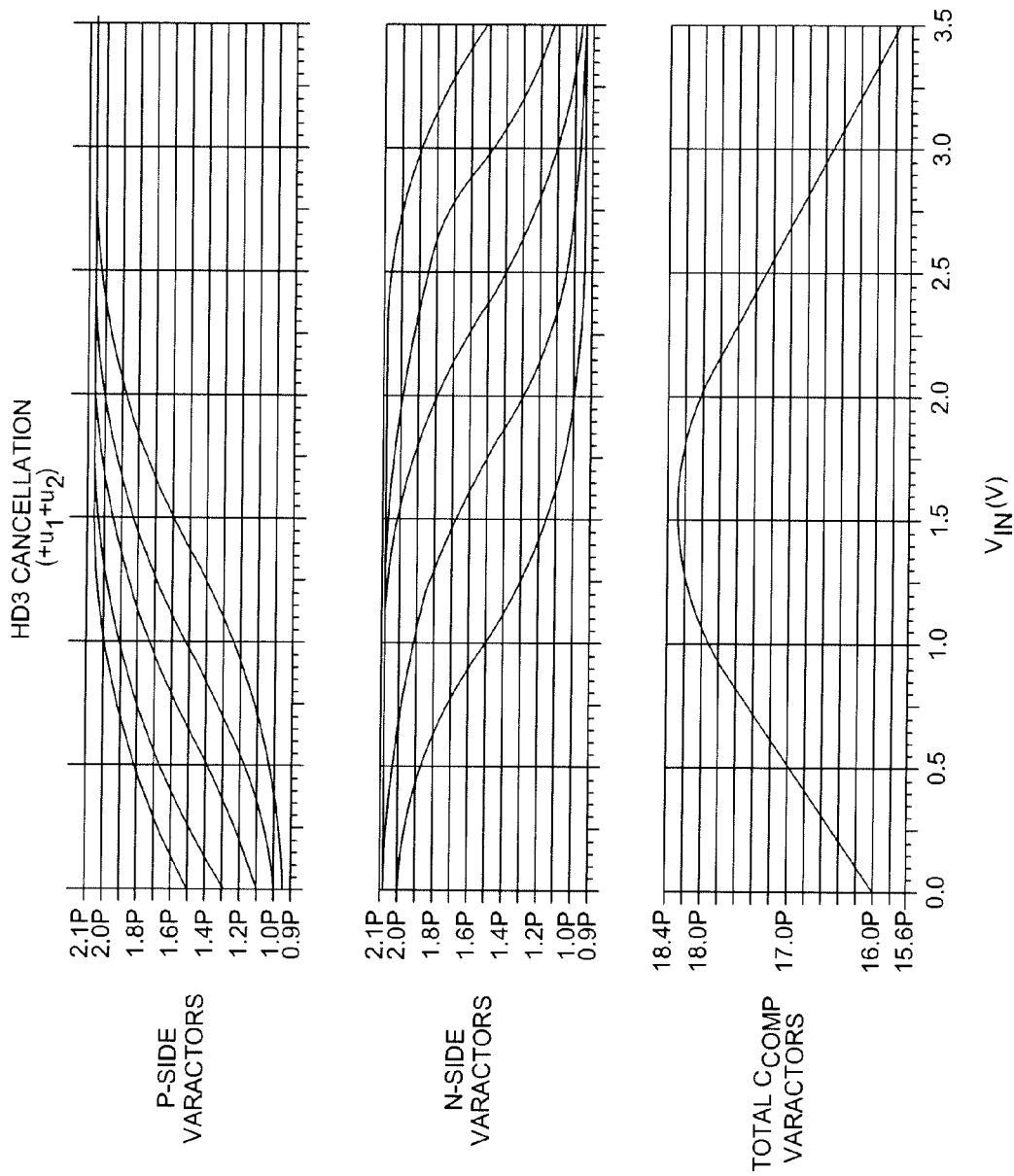

FIG. 15 shows the detail of the staggered varactor capacitive characteristics, as positioned on the x-axis by the bias tuning circuit of the embodiment of FIG. 6. The parallel combination of the varactors of set 604 (top plot) and set 606 (middle plot) yields a characteristic $C_{COMP}(V_{IN})$ (bottom plot) which is parabolically convex in the operative region of interest.

Figure 16:
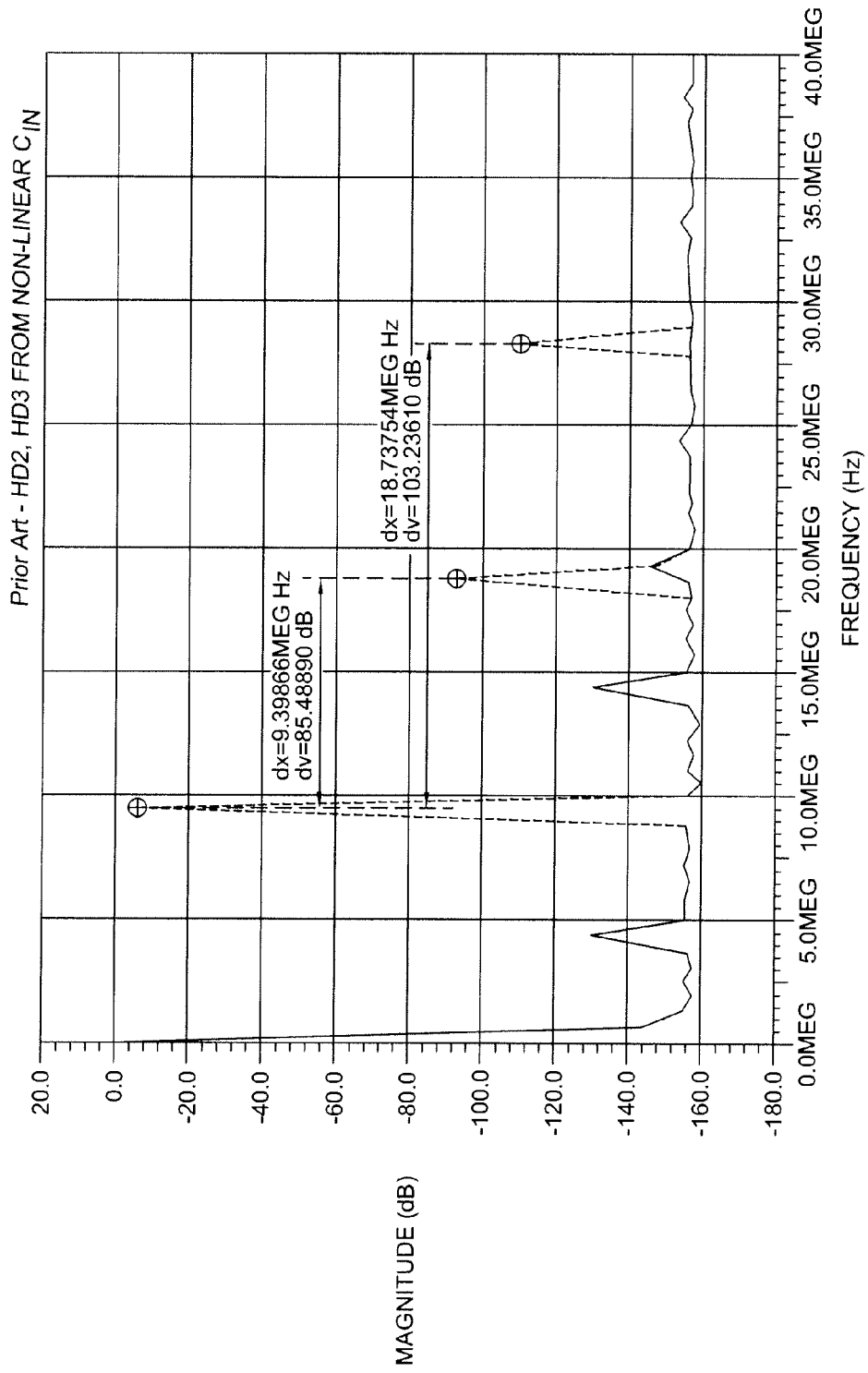

FIG. 16 (prior art) shows the extent of harmonic distortion HD2 and HD3 that a combined linear+parabolic dependency of the input capacitance CIN(VIN) such as shown in FIG. 12 (top plot) can impart on an ideal sinusoid fed to the front-end through an ideal resistor. In this case a sampling front-end operated at 80 MSps receives a spectrally pure input sinusoid at about 89.4 MHz, whose spectrum is also shown versus frequency in FIG. 16, returning a sinusoid whose Discrete-Fourier Transform (DFT) is corrupted by −85.5 dBc HD2 and −103.2 dBc HD3 tones.

Figure 17:
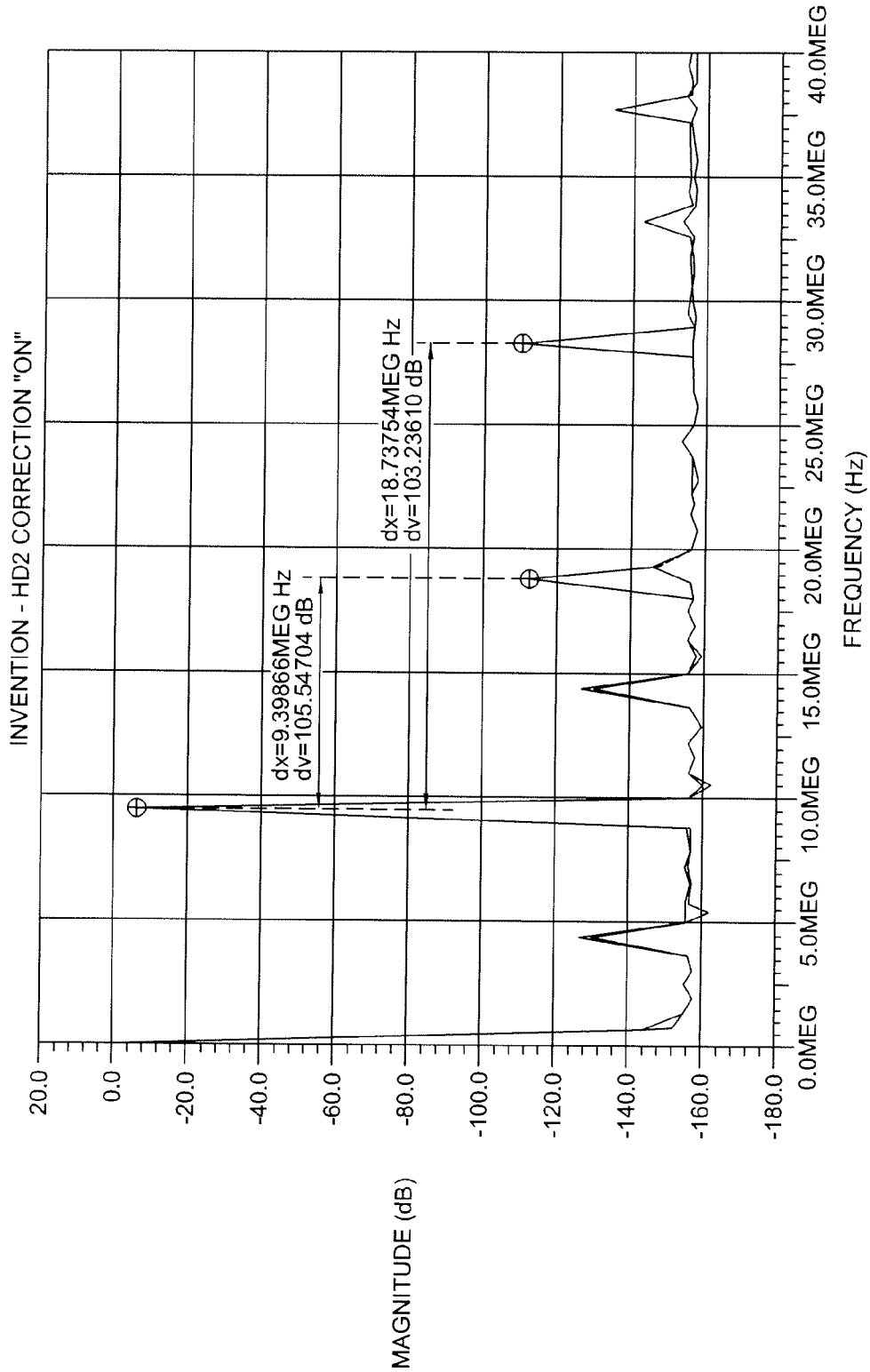

FIG. 17 shows harmonic cancellation performance according to the embodiment of the present invention of FIG. 6, in which only HD2 correction is operated. While the HD3 tone is virtually unchanged, the HD2 tone is brought from −85.5 dBc down to −105.5 dBc, for a distortion improvement of about 20 dB.

Figure 18:
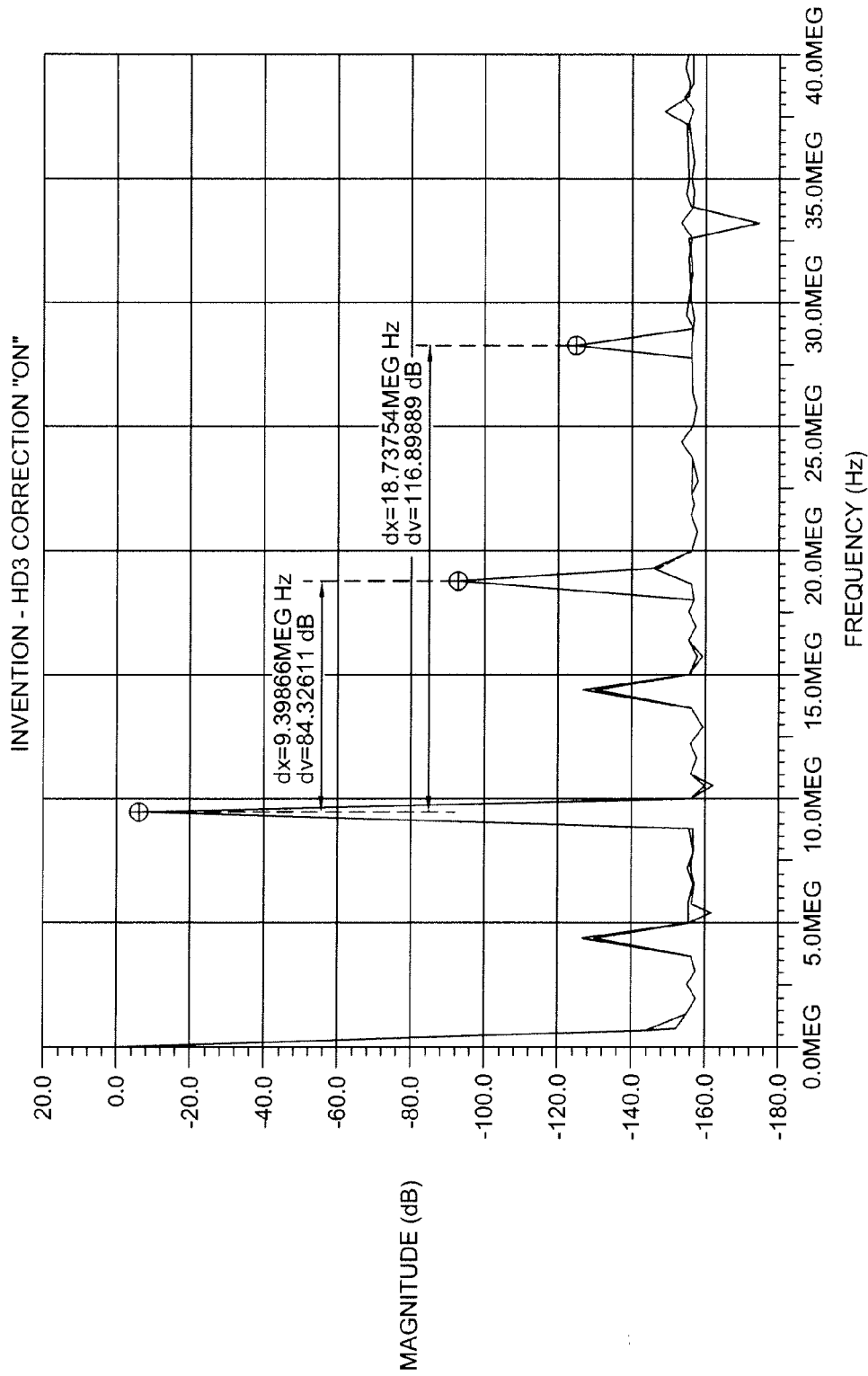

FIG. 18 shows harmonic cancellation performance according to the embodiment of the present invention of FIG. 6, in which only HD3 correction is operated. While the HD2 tone is virtually unchanged, the HD3 tone is brought from −103.2 dBc down to −116.9 dBc, for a distortion improvement of about 13.7 dB.

While the invention has been particularly shown and described with reference to a preferred embodiment thereof, it will be understood by those skilled in the art that various other changes in the form and details may be made without departing from the spirit and scope of the invention.

I claim:

1. A capacitance compensation circuit comprising:
   an input terminal;
   a circuit to compensate for input capacitance increasing against the input terminal voltage, comprising a first plurality of switches having a first node coupled to the input terminal, a first plurality of capacitors each coupled to a respective second node of the first plurality of switches, and a first adjustment circuit for providing a first plurality of bias levels to a first plurality of switch control nodes; and
   a circuit to compensate for input capacitance decreasing against the input terminal voltage, comprising a second plurality of switches having a first node coupled to the input terminal, a second plurality of capacitors each coupled to a respective second node of the second plurality of switches, and a second adjustment circuit for providing a second plurality of bias levels to a second plurality of switch control nodes.

2. The capacitance compensation circuit of claim 1 wherein the plurality of switches comprises a plurality of devices inactivated by a switching voltage thereof exceeding a threshold voltage.

3. The capacitance compensation circuit of claim 1 wherein the plurality of switches comprises a plurality of devices activated by a switching voltage thereof exceeding a threshold voltage.

4. The capacitance compensation circuit of claim 1 wherein the first and second adjustment circuits each comprise a resistor string and at least one adjustable current source.

5. The capacitance compensation circuit of claim 1 wherein the first and second adjustment circuits each comprise an adjustable bias source for simultaneously adjusting all of the bias levels.

6. The capacitance compensation circuit of claim 1 wherein the first and second adjustment circuits each comprise a plurality of adjustable bias sources for individually adjusting the bias levels.

7. A capacitance compensation circuit comprising:
   an input terminal;
   a circuit to compensate for input capacitance increasing against the input terminal voltage, comprising a first plurality of varactors having a first node coupled to the input terminal, and a first adjustment circuit for providing a first plurality of bias levels coupled to a first plurality of second varactor nodes; and
   a circuit to compensate for input capacitance decreasing against the input terminal voltage, comprising a second plurality of varactors having a first node coupled to the input terminal, and a second adjustment circuit for providing a second plurality of bias levels to a second plurality of second varactor nodes.

8. The capacitance non-linearity compensation circuit of claim 7 wherein the first plurality of varactors comprises a plurality of N-type MOS accumulation varactors.

9. The capacitance non-linearity compensation circuit of claim 7 wherein the second plurality of varactors comprises a plurality of P-type MOS accumulation varactors.

10. The capacitance compensation circuit of claim 7 wherein the first and second adjustment circuits each comprise an adjustable bias source for simultaneously adjusting all of the bias levels.

11. The capacitance compensation circuit of claim 7 wherein the first and second adjustment circuits each comprise a plurality of adjustable bias sources for individually adjusting the bias levels.

12. The capacitance compensation circuit of claim 7 wherein the first adjustment circuit comprises a first resistor string and a first current source, and the second adjustment circuit comprises a second resistor string and a second current source.

13. The capacitance compensation circuit of claim 12 further comprising a third current source coupled between the first and second current source.

* * * * *